(12) United States Patent
Nadeau-Dostie et al.

(10) Patent No.: US 6,510,534 B1
(45) Date of Patent: Jan. 21, 2003

(54) METHOD AND APPARATUS FOR TESTING HIGH PERFORMANCE CIRCUITS

(75) Inventors: Benoit Nadeau-Dostie, Aylmer (CA); Fadi Maamari, San Jose, CA (US); Dwayne Burek, San Jose, CA (US); Jean-Francois Cote, Chelsea (CA)

(73) Assignee: LogicVision, Inc., San Jose, CA (US)

( * ) Notice: Subject to any disclaimer, the term of this patent is extended or adjusted under 35 U.S.C. 154(b) by 361 days.

(21) Appl. No.: 09/607,128

(22) Filed: Jun. 29, 2000

(51) Int. Cl.[7] .............................................. G01R 31/28
(52) U.S. Cl. ....................... 714/724; 714/726; 714/729; 714/731
(58) Field of Search ................................ 714/724, 726, 714/727, 728, 731, 733, 736, 30, 735, 729; 327/765; 365/201

(56) References Cited

U.S. PATENT DOCUMENTS

| | | | |
|---|---|---|---|
| 5,349,587 A | | 9/1994 | Nadeau-Dostie et al. ... 714/729 |
| 5,450,418 A | * | 9/1995 | Ganapathy .................. 714/735 |
| 5,889,788 A | * | 3/1999 | Pressly et al. ............... 714/726 |
| 6,145,105 A | * | 11/2000 | Nadeau-Dostie et al. ... 714/726 |
| 6,327,684 B1 | * | 12/2001 | Nadeau-Dostie et al. ... 714/731 |
| 6,327,685 B1 | * | 12/2001 | Koprowski et al. ......... 365/201 |
| 6,442,722 B1 | * | 8/2002 | Nadeau-Dostie et al. ... 714/731 |

FOREIGN PATENT DOCUMENTS

EP 0 549 130 A2 6/1993

* cited by examiner

*Primary Examiner*—Emmanuel L. Moise
(74) *Attorney, Agent, or Firm*—Sheridan Ross P.C.

(57) ABSTRACT

A method for at-speed testing high-performance digital systems and circuits having combinational logic and memory elements that may be both scannable and non-scannable is performed by enabling at least two clock pulses during a capture sequence following a shift sequence. The method provides for initialization of any non-scannable memory elements via the scannable memory elements at the beginning of the test before an at-speed test is performed. During initialization, control logic generates a signal to disable the generation of system clock pulses for capture. Instead, only one clock cycle derived from the test clock or a system clock is generated to initialize the non-scannable elements. The number of shift sequences required depends on the maximum number of non-scannable elements that must be traversed between two scannable memory elements. During the same initialization period, the output response analyzer is disabled since unknown data values will present in the stream of data shifted out. A test controller is clocked a test clock and includes a clock generation module for generating shift and capture clocks. The test clock can be an independent and asynchronous clock or derived from the system clock. The test can also be performed by using only the test clock in the case only the test clock is available or for diagnostic and debug purposes.

44 Claims, 4 Drawing Sheets

2 clock cycles (minimum)

Fig. 6.

METHOD AND APPARATUS FOR TESTING HIGH PERFORMANCE CIRCUITS

The present invention relates, generally, to the testing of digital systems and circuits and, more specifically, relates to a method for use in testing of high-performance digital systems and circuits and to a test controller for implementing the method.

BACKGROUND OF THE INVENTION

The testing of digital systems and circuits has become a highly advanced art. Generally, integrated circuits include combinational or core logic which perform the functions for which the circuits were designed. Input and output pins are provided for passing signals to and from the core logic from other components. Memory elements are provided in the chip for storing data. Some memory elements, but not necessarily all, are constructed so that the memory elements can be connected in series to form a scan chain and allow a test stimulus to be loaded into the memory elements and response data to be unloaded therefrom for analysis. A built-in test controller is provided for controlling test operations. Tests typically involve loading a test stimulus into the scannable memory elements, operating the circuit in normal mode for at least one cycle of a test clock and then unloading the data from the memory elements for analysis.

In some tests, the test clock is provided by test equipment and is frequently not the clock speed for which the chip or circuit was designed. It is desired to perform at-speed tests of the circuit at all levels of packaging of the circuit, i.e., wafer probe, final test, burn-in, board and system test, etc. One difficulty which requires a solution is the provision of a method for generating capture and shift clocks from a free-running clocks in circuits having "clocked scan" type memory elements. Co-pending U.S. patent application Ser. No. 09/430,686 filed on Oct. 29, 1999 for "Method and Apparatus for Testing Circuits with Multiple Clocks", now U.S. Pat. No. 6,442,722, assigned to the Assignee of the present invention, addresses this problem for circuits containing only scannable memory elements of the "muxed scan" type in which the memory elements are clocked by the same clock during both the shift and capture sequences. However, the method used to implement at-speed testing is not applicable to the "clocked scan" methodology. Other prior art applicable to "clocked scan" methodology, does not address the problem of generating capture and shift clocks from free-running clocks because the clocks are controlled from a tester external to the chip. These previous methods are not applicable when the system clock frequency is too high and the test equipment cannot provide the desired clock because of parasitic effects in the connections between the tester and the circuit under test. An on-chip clock generator providing a free-running clock is more appropriate in this case.

Another situation which requires a solution is the need to re-test the circuit in the system where clocks are typically generated from crystals or other sources that cannot be controlled in a way that is compatible with the shift and capture sequences required by the clocked scan methodology.

A further difficulty that must be overcome is the need to properly initialize a circuit under test which contains non-scannable memory elements. In such an arrangement, the first shift sequence alone is not sufficient to initialize all memory elements and ensure that no unknown values propagate back to the test controller. At the beginning of the test, all memory elements contain an unknown value. The scannable memory elements are initialized by shifting in known values from the test controller. Since the non-scannable memory elements only receive the capture clock, their respective value remains unknown. At the end of the test stimulus loading sequence, a first capture clock is applied to the memory elements. The unknown values contained in non-scannable memory elements propagate through the combinational logic and will cause unknown values to be captured by the scannable memory elements.

Also, the non-scannable memory elements which receive data originating from scannable memory elements will capture known values since their inputs only depend on the output of memory elements that have been initialized. However, if a second capture clock cycle is applied to perform an at-speed test, unknown data will propagate to the non-scannable memory elements. An associated problem relates to "sequential loops", i.e., non-scannable memory elements whose outputs are connected to their inputs through the combinational logic.

A still further problem relates to performing at-speed tests in absence of the system clock when the system clock is not available as required for diagnostic purposes.

SUMMARY OF THE INVENTION

The present invention seeks to provide a method of testing high performance circuit digital systems and circuits which employ clocked scan type scannable memory elements One aspect of the present invention relates to a method of testing high performance digital systems and circuit using a free running test clock and a free running system clock. In accordance with this aspect of the invention, there is provided a method of performing an at-speed test of a circuit having combinational logic and scannable, clocked scan type memory elements each scannable memory element having a capture clock input, a shift clock input, the method comprising loading a test stimulus into the scannable memory elements under the control of a shift clock derived from a free running test clock; performing a capture operation under the control of a capture clock derived from one of the free running test clock and a free running system clock for a predetermined number of cycles of the capture clock; and unloading test response data from the scannable memory elements under the control of the shift clock.

Another aspect of the present invention relates to a method for performing at-speed tests of high performance digital systems and circuits using a test clock and a system clock but which is capable of performing a test using only the test clock when the system clock is not available. In accordance with this aspect of the invention, there is provided a method of performing an at-speed test of a circuit having combinational logic and scannable, clocked scan type memory elements each scannable memory element having a capture clock input, a shift clock input, the method comprising configuring the circuit in an active or an inactive debug mode; when the circuit is configured in an active debug mode, loading a test stimulus into the scannable memory elements under the control of a shift clock signal derived from a test clock; performing a capture operation under the control of a capture clock derived from the test clock for a predetermined number of cycles of the capture clock; and unloading test response data from the scannable memory elements under the control of the shift clock signal; and when the circuit is configured in an inactive debug mode, loading a test stimulus into the scannable memory elements under the control of a shift clock signal derived from a test clock; performing a capture operation under the control of a capture clock derived from one of the test clock and a system clock for a predetermined number of cycles of the capture clock; and unloading test response data from the scannable memory elements under the control of the shift clock signal.

A further aspect of the present invention relates to a method of testing high performance digital systems and circuits which include non-scannable memory elements. In accordance with this aspect of the invention, there is provided a method of performing an at-speed test of a circuit having combinational logic and scannable, clocked scan type memory elements each scannable memory element having a capture clock input, a shift clock input, the method comprising configuring the circuit in an active or an inactive initialization mode; when the circuit is configured in an active initialization mode, iteratively loading initialization data into the scannable memory elements and then performing a capture cycle under the control of one of the test and system clocks until all non-scannable memory elements in the circuit have been initialized with a known value and then deactivating the initialization signal; loading a test stimulus into the scannable memory elements under the control of a shift clock signal derived from the test clock; performing a capture operation under the control of a capture clock derived from one of the test clock and system clock for a predetermined number of cycles of the capture clock; and unloading test response data from the scannable memory elements under the control of the shift clock signal.

BRIEF DESCRIPTION OF THE DRAWINGS

These and other features of the invention will become more apparent from the following description in which reference is made to the appended drawings in which.

DETAILED DESCRIPTION OF PREFERRED EMBODIMENTS OF THE INVENTION

Figure 1:
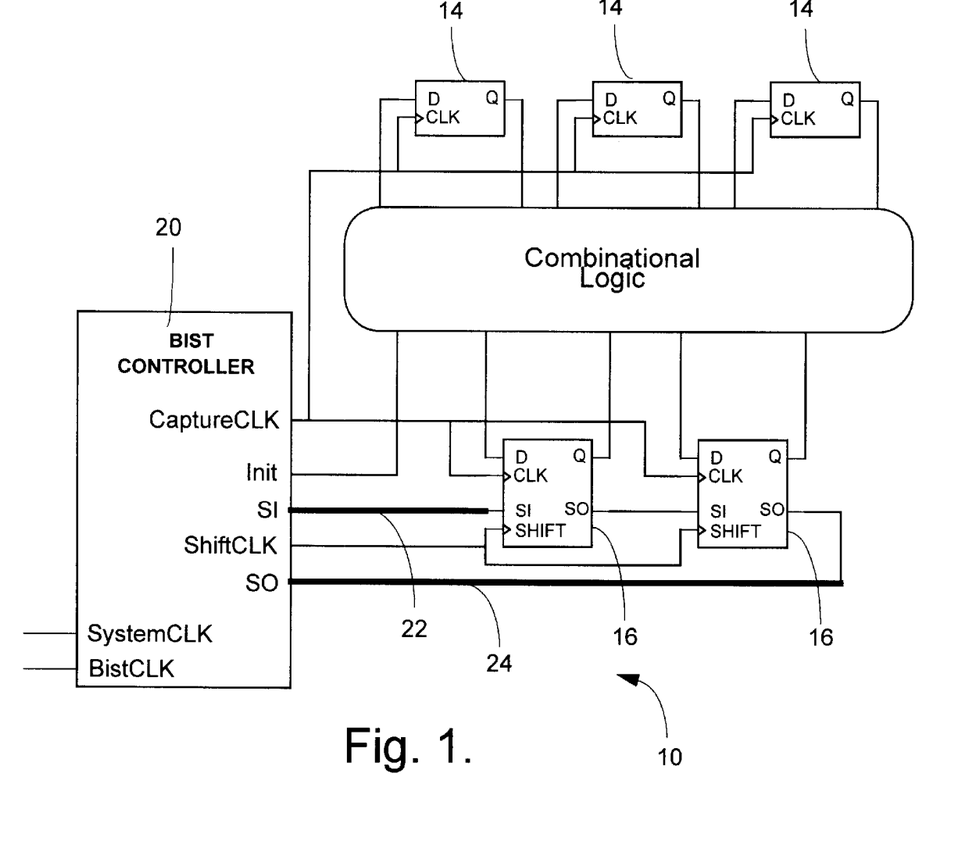
FIG. 1 illustrates a simple integrated circuit having combinational logic, scannable and non-scannable memory elements and a test controller according to the present invention.

FIG. 1 illustrates a highly simplified circuit 10 having interconnected combinational logic 12 and memory elements 14 and 16 and a Test or Built-In Self-Test (BIST) controller 20. All memory elements are provided with a clock input, CLK, a data input, D, and an output, Q. These inputs and output are necessary for the circuit to perform, during normal operation, the functions for which the circuit was designed. Some memory elements, referred to herein as "scannable memory elements" 16, are provided with additional inputs and an output for connecting the scannable memory elements in a scan chain. Memory elements 14 do not have these additional inputs and output and are referred to herein as "non-scannable memory elements". The additional ports include a SHIFT port which is a clock input for receiving a shift clock which operates to move data along the scan chain; an input port SI for receiving data and an output port SO for transmitting data to another element in the scan chain or to the controller, as the case may be. It is assumed in this example that both clocks are active on their respective rising edge. That is, data is transferred from D to Q when CLK rises and from SI to SO when SHIFT rises. However, it will be clear to those skilled in this art that the active polarities could be different. Also, output ports SO and Q could be the same port.

The serial data input to the scan chain(s) is connected to an SI output port 22 of the main test controller 20 and the serial data output of the scan chain is connected to an SO input port 24 of the test controller. While more than one scan chain is typically used, only one scan chain is shown to simplify the description. The clock input CLK of the memory elements is connected to a CaptureClock output port of the test controller. The shift clock SHIFT input is connected to the ShiftCLK output port of the controller. The scan methodology used with the scannable memory elements illustrated is referred to as "clocked scan".

The test controller receives two clocks including a system clock, SystemCLK, and a test clock, BistCLK, both of which, typically, would be free-running. SystemCLK and BistCLK can be generated on-chip or received at a chip input. The test clock can also be derived from the system clock. Typically, the system clock will have a higher frequency than the test clock.

In order to perform an at-speed test in a circuit that contains only scannable memory elements, i.e., there are no non-scannable memory elements 14, the scannable memory elements are initialized by loading or shifting test stimulus data output by the controller into the scannable memory elements 16. This is done by a shifting or loading sequence which involves applying a sufficient number of clock pulses to the shift clock and providing appropriate data to the scan chain input SI.

Once the shift sequence has been completed, the shift clock is disabled, the capture clock is enabled and two or more clock cycles of the capture clock, CaptureCLK, are applied to the CLK clock inputs of the memory elements. These clock pulses are derived from the system clock in order to create conditions that are similar to those which exist during normal operation. As mentioned, the shift clock is put in its an inactive state during this capture sequence. After the capture sequence has been completed, the capture clock is held inactive, the shift clock is re-enabled and the response data of the memory elements is unloaded or shifted out for analysis by the test controller.

One of the objectives of this invention is to enable at-speed tests of the circuit at all levels of packaging of the circuit, i.e., wafer probe, final test, burn-in, board and system test, etc. The first difficulty to solve is to provide a method of generating the capture and shift clock from free-running clocks. Co-pending U.S. patent application Ser. No. 09/430, 686 filed on Oct. 29, 1999 for "Method and Apparatus for Testing Circuits with Multiple Clocks", now U.S. Pat. No. 6,442,722 assigned to the Assignee of the present invention, addresses this problem for circuits containing only scannable memory elements of the "muxed scan" type where the memory elements are clocked by the same clock during both the shift and the capture sequence. However, the method used therein to implement at-speed testing is different from that required in and is not applicable to "clocked scan" methodology.

In other prior art applicable to "clocked scan" methodology, the problem of generating capture and shift clocks from free-running clocks is not addressed because the clocks are controlled from a tester which is external to the chip. These previous methods are not applicable when the system clock frequency is too high and the tester cannot provide the clock because of parasitic effects in the connections between the tester and the circuit under test. An on-chip clock generator providing a free-running clock is more appropriate in this case. Another situation in which a new method is required is for re-testing a circuit in a system in which clocks are typically generated from crystals or other sources that cannot be controlled in a way that is compatible with the shift and capture sequences required by clocked scan methodology.

Figure 2:
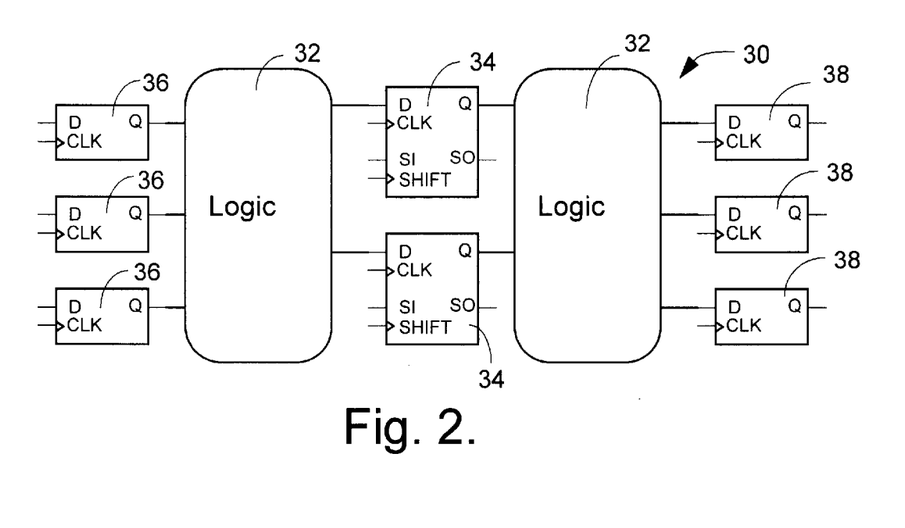
FIG. 2 illustrates a portion of a simple circuit that requires initialization prior to an at-speed test.

A second difficulty that must be overcome is proper initialization of a circuit which contains non-scannable memory elements such as is shown in FIGS. 1 and 2. FIG. 2 shows a portion of a circuit 30 with a specific arrangement of combinational logic 32 and memory elements, including scannable memory elements 34 and non-scannable memory elements 36 and 38. When testing such an arrangement, the test stimulus loading or shift sequence alone is not sufficient to initialize all memory elements and ensure that no unknown value propagates to the test controller. That is because, at the beginning of the test, all memory elements contain an unknown value. In the first step of the method described earlier for circuits which do not contain non-scannable memory elements, the scannable memory elements are initialized by shifting in known values from the test controller. Since the non-scannable memory elements only receive the capture clock, their respective value remains unknown. At the end of the shift sequence, a first capture clock is applied. The unknown values contained in non-scannable memory elements 36 on the left hand side of FIG. 2 will propagate through the combinational logic 32 and will cause unknown values to be captured by the scannable memory elements 34. The non-scannable memory elements 38 on the right hand side of the FIG. 2 will capture known values since their respective input only depends on the output of memory elements 38 that have been initialized. However, if a second capture clock cycle is applied to perform an at-speed test, the unknown data, which was applied to the scannable memory elements 34 in the first capture cycle, will propagate to memory elements 38.

In order to guarantee that the circuit is initialized, the method of the present invention introduces a non-scannable memory element initialization procedure prior to the loading sequence described earlier. In the initialization procedure, the test controller of the present invention applies a series of shift and capture sequences with a capture sequence which comprises only one clock cycle. This procedure provides for the gradual elimination of unknown values from the circuit. During this initialization period, the analysis of the data coming out of the scan chain must be disabled. Otherwise, the signature resulting from the test would not be repeatable. The number of shift and capture sequences depends on the "sequential depth" of the circuit. The sequential depth is defined as the maximum number of non-scannable memory elements found in any path between two scannable memory elements in the circuit. There is an assumption that the circuit does not contain any sequential loops during the initialization period. That is, there are no paths from a non-scannable memory element output that can lead to its input. However, if the combinational logic does include sequential loops, the Init signal can be applied to the combinational logic, as shown in FIG. 1, and the combinational logic can be designed to disable the sequential loops when it detects an active Init signal.

Figure 3:
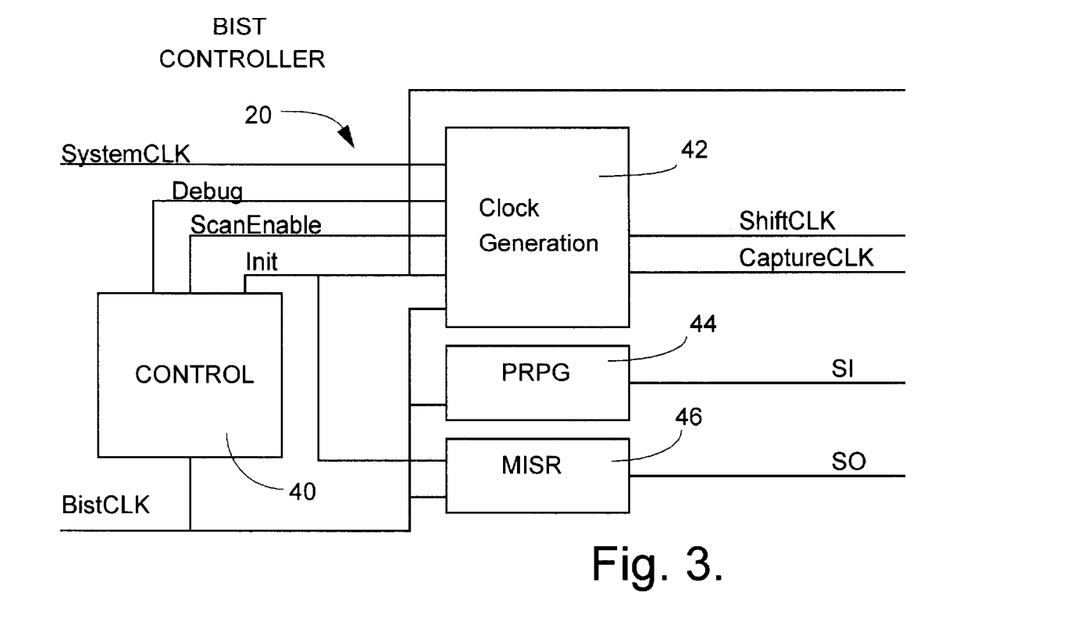
FIG. 3 illustrates a simplified block diagram of the test controller according to a preferred embodiment of the present invention.

A third problem is addressed by the present invention. It must be possible to run the test in absence of the system clock when the system clock is not available. This capability is useful for diagnostic purposes. FIG. 3 shows various modules of the test controller that addresses all problems described above.

With reference to FIG. 3, the controller 20 will be seen to include a control module 40, a clock generation module 42, a Pseudo-Random Pattern Generator (PRPG) 44 and Multiple-Input Signature Register (MISR) 46. The control module receives the test clock and other inputs (not shown), which are not material to the present invention, and generates several output signals including a ScanEnable signal which, when active (logic high), indicates that a shift sequence is in process and, when inactive (logic low), that a capture sequence is in process; an Init signal which, when active (logic high), indicates that the circuit is in an initialization phase and, when inactive (logic low), that the circuit is or has been initialized, and a Debug signal which, when active (logic high), indicates that the test is to be performed using the test clock only for both shift and capture sequences and, when inactive (logic low), that the at-speed capture sequences are to be performed using the system clock. Other signals generated by the control module are not shown.

The clock generation module receives the three control signals described above as well as the system clock and test clock and generates the shift and capture clocks, ShiftCLK, and CaptureCLK, respectively. During normal operation of the circuit, the system clock, SystemCLK, is connected directly to the CaptureCLK output of the controller, the test clock is not used and the shift clock, ShiftCLK, is held inactive, logic low in this example. During a test, the shift clock is derived from the test clock and the capture clock is derived from the system clock for an at-speed capture sequence and from the test clock during initialization and debug sequences. However, it should be understood that the system clock could be used during initialization, if desired, without departing from the present invention.

Signature register 46 receives the serial data from the scan chain(s) and the Init signal. MISR 46 will not start analyzing the data received from the scan chain until the Init signal becomes inactive (logic low), indicating that the circuit has been completely initialized. At the end of a test, the MISR will contain the signature of the circuit. This signature can be compared to a reference signature contained in the test controller or the contents of the signature register can be shifted out for inspection. MISRs are well known in the art and are not described in more detail. PRPG 44 provides data to the circuit under test via the scan chains at the pace of the shift clock. PRPGs are also well known in the art and are not discussed further. The controller also has other inputs and outputs used to initiate the test and collect the test results. These are well known in the art and are not shown or described herein.

Figure 4:
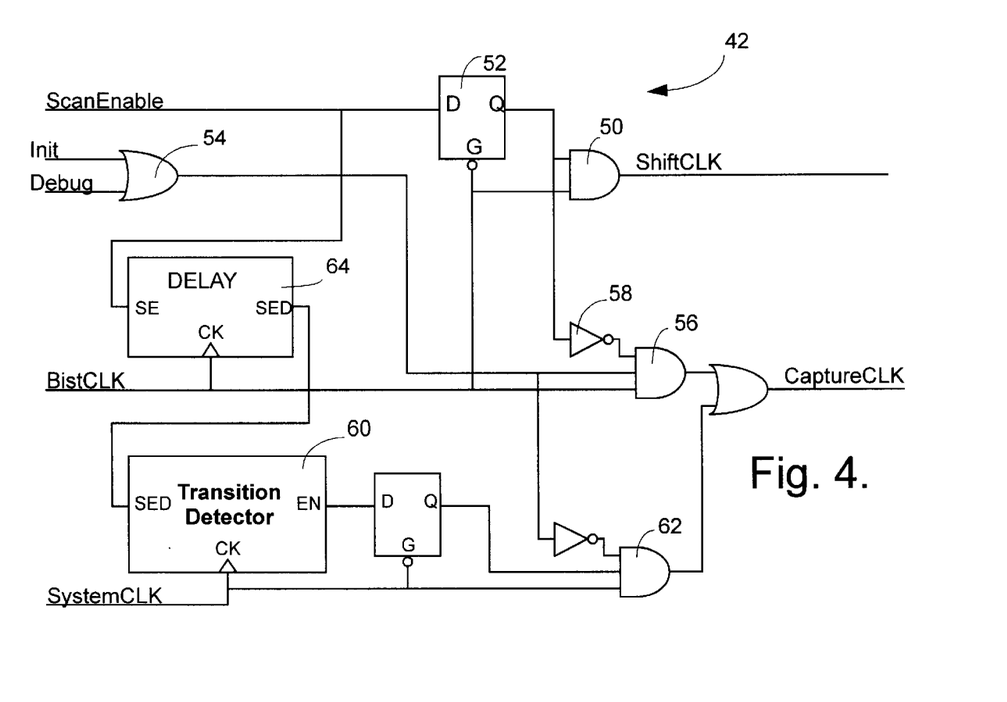
FIG. 4 illustrates a clock generation module according to a preferred embodiment of the present invention.

FIG. 4 illustrates one embodiment of a clock generation module 42 which supports the method of the present invention. The shift clock, ShiftCLK, is generated simply by gating the ScanEnable signal with the test clock using an AND gate 50. A latch 52 is provided to ensure a race-free operation so that glitches are not generated on the ShiftCLK output.

The Init and Debug signals are applied to an OR gate 54 whose output is applied to one input of an AND gate 56. The output of latch 52 is inverted by inverter 58 and applied to a second input of AND gate 56. The test clock, BistCLK, is applied to a third input of AND gate 56. Thus, in the illustrated embodiment, a shift clock derived from the test clock is used for all memory element loading and unloading operations.

The capture clock, CaptureCLK, has two potential sources. During initialization or debug when either Init or Debug, or both, is active, the capture clock is obtained by gating the test clock with the inverse of the ScanEnable signal using AND gate 56. When at-speed testing is enabled, when both Init and Debug are inactive, the capture clock is obtained by gating the output of a transition detector circuit 60, which detects a falling transition on a delayed version of the ScanEnable signal, and the system clock by means of an AND gate 62. This more complex circuitry is required because the system and test clocks are typically asynchronous to each other in the situations of interest and, therefore, must be synchronized.

Figure 6:
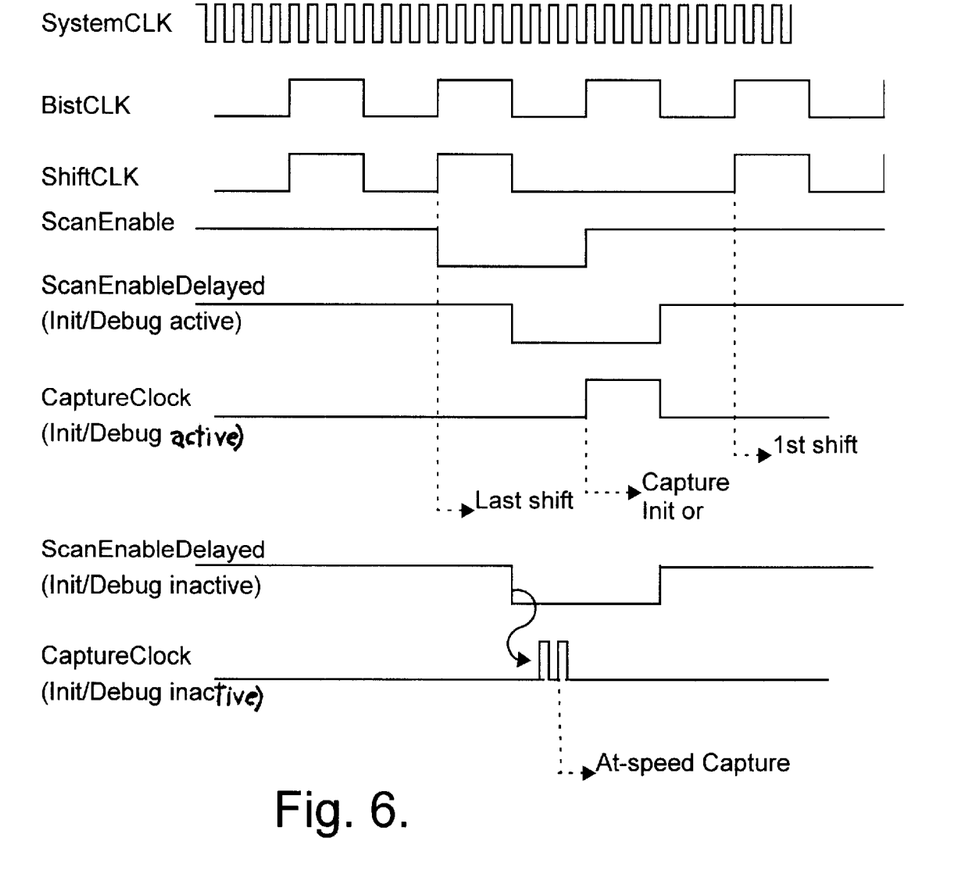
FIG. 6 is a timing diagram illustrating the state of the key signals during an at-speed test according to one embodiment of the method and of the test controller of the present invention.

The ScanEnable control signal is delayed in a delay circuit 64 which produces a capture clock control signal SED, which is shown as ScanEnableDelayed in the timing diagram of FIG. 6. Delay circuit 64 uses memory elements (not shown) whose clock inputs are connected to the test clock signal. Preferably, memory elements which can update in response to the rising or falling edge of the clock signal are employed in order to provide for delays of the control signal by ½, 1, 1 ½, etc . . . clock cycles. The delay is chosen such that the capture clock derived from the system clock signal becomes active after the data has had sufficient time to propagate from scannable memory elements to all other memory elements and some time before the response data unloading shift sequence starts. In the simple circuit illustrated, ScanEnable is delayed by half a clock cycle of the test clock. The delay must take into account the delay introduced by transition detector 60, described below, whose clock input is connected to the system clock signal.

Figure 5:
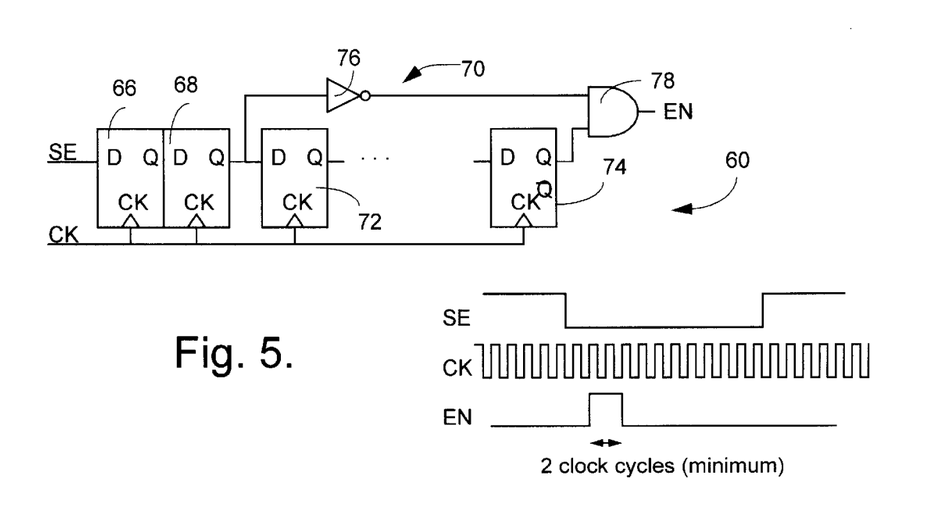
FIG. 5 illustrates one embodiment of a transition detector used in the clock generation module.

FIG. 5 illustrates a transition detector circuit 60 which is suitable for the purposes of the present invention. Since the test and system clocks can be asynchronous to each other, the control signal generated using the test clock must be synchronized with the system clock. This is done by sampling the delayed control signal, SED, using memory elements connected in series. Usually, two memory elements 66 and 68, are sufficient to guarantee that the delayed control signal is well synchronized and that the circuit will not enter into a metastable state. This method of synchronizing is well known in the art.

The second part 70 of transition detector 60 generates a capture clock enable signal, EN, and includes a pair of memory elements 72 and 74, an inverter 76 and an AND gate 78. An active value of the capture clock enable signal enables the capture clock. An inactive value disables the capture clock. The active value is generated in response to a transition from an active to an inactive value of the synchronized delayed control signal, SED. The active value is generated for a predetermined number of system clock cycles corresponding to the number of memory elements located after memory element 68. The output of memory element 64 is the inverted value synchronized delayed control signal, SED. Inverter 76 inverts the signal and applies it to AND gate 78. In the illustrated circuit and as shown in the timing diagram in FIG. 5, the number of memory elements is two. However, any number can be used. The controller can be designed such that this number is variable by providing a chain of memory elements which is as long as the maximum number of system clock cycles desired and a mechanism to select the output of any one of the memory elements of this chain to apply to the second input of the AND gate generating the enabling signal EN. Such circuitry is not shown but well known to those skilled in the art.

The timing diagram of FIG. 6 shows the relationship of the key signals used in the method of the present invention. The system clock signal, SystemCLK, is shown to be approximately eight times faster than the test clock signal, BistCLK, in this example. Both the system and test clocks are free-running.

Prior to the start of a test, the shift and capture clocks are both disabled. An at-speed test according to the method of the present invention in a circuit which contains non-scannable memory elements requiring initialization would comprise the following.

The controller would be initialized by providing an appropriate test mode signal (not shown) as is well known in the art. The shift and capture clocks are disabled. The first step is to initialize all non-scannable memory elements. To do so, the shift clock is enabled by gating the free-running test clock and generating an active ScanEnable signal and an active initialization signal, Init. Initialization data is shifted into all scannable memory elements according to a shift sequence determined by the PRPG.

At the end of this shift sequence, the ScanEnable signal is deactivated and the shift clock is disabled in response to the inactive ScanEnable signal. The capture clock is enabled and generated from the free-running test clock in response to the transition from an active to an inactive value of the ScanEnable signal for a single clock cycle of the test clock. This is shown by the first CaptureClock waveform 80 in FIG. 6. It will be noted that the ScanEnable signal is inactive for one clock cycle of the test clock, BistCLK. This causes the initialization data which was loaded into the scannable memory elements to be applied to the combinational logic and causes the combinational logic to apply outputs to various memory elements connected to it, including non-scannable memory elements. At the end of this initialization sequence, the ScanEnable signal is again activated causing the shift clock to be re-enabled by gating the free-running test clock. Throughout the initialization sequence just described, the Init signal was kept active which caused the clock generation signal to generate a capture clock using the test clock rather than the system clock.

It should be noted that it is possible to use the system clock instead of the test clock to generate the capture clock. This could be achieved by placing a multiplexer between memory elements 72 and 74 and AND gate 78. When init is active, the output of memory element 72 would be applied to AND gate 78. When init is inactive, the output of memory element 74 would be applied to AND gate 78. Thus, a single clock pulse derived from the system clock would be applied to all memory elements during the capture cycle of the initialization period.

The above described initialization sequence is repeated as many times as necessary to ensure that all non-scannable memory have been loaded with known data. As previously mentioned, the number of iterations depends on the sequential depth of the circuit. This number is predetermined for any given circuit and programmed into the test controller. When all of the initialization iterations have been completed, the at-speed test is performed in the same manner as that of a circuit having no non-scannable memory elements, as described below.

Generally, a test stimulus is loaded into all scannable memory elements and then a capture sequence is executed under the control of the system clock. More specifically, an inactive value of the initialization signal, Init, is generated and an active ScanEnable signal is generated. A test stimulus is shifted into all scannable memory elements according to a shift sequence while shifting out and analyzing the output response of a previous test. However, it should be noted that the MISR is disabled during the first loading sequence following the initializing sequences because the memory elements will not contain valid response data. At the end of this loading operation, the ScanEnable signal is deactivated which causes the shift clock to be disabled. A control signal (ScanEnableDelayed/SED) is kept active for a predetermined number of half clock cycles (which includes zero cycles) of the test clock and then disabled. This is achieved in delay circuit 64. This falling transition is detected by transition detector 60 which produces an active capture clock enable signal, EN, which, in turn, causes at least two clock cycles of the SystemCLK to be output as the capture clock to the CLK input of the memory elements. This completes the at-speed capture sequence which caused the test stimulus to be applied to the combinational logic and the latter to respond to it by applying response data into the memory elements.

The response data is then unloaded from the scannable memory elements by again activating the ScanEnable signal which causes the shift clock to be re-enabled by gating of the free-running test clock. This causes the response data to be loaded into the MISR where it is analysed and a circuit signature is produced and validated.

In summary, during the initialization sequences, the ScanEnable signal is shown to be inactive for one period of the test clock, the capture cycle, as is normally the case for a scannable circuit using "muxed scan" methodology. The shift clock is active and is essentially a copy of the test clock while ScanEnable is active. The shift clock is inactive when ScanEnable is inactive.

During initialization and debug, the capture clock is derived from the test clock and a single pulse is applied and no delay is imposed prior to enabling the test clock. When the initialization period is completed and the circuit is not in debug mode, the control signal is delayed and the falling transition of the delayed control signal is detected by the transition detector that generates two clock cycles (or more) of a capture clock derived from the system clock. These two pulses cause an at-speed test to be applied.

The circuit as shown will work well for any frequency ratio greater than four. This is typical for high-performance circuits. If a lower frequency ratio is required and the test clock frequency cannot be changed, the effective shift clock frequency must be reduced to maintain a frequency ratio greater than four with respect to the capture clock frequency. Two methods are available to handle this situation. Nadeau-Dostie et al U.S. Pat. No. 5,349,587 and Nadeau-Dostie et al U.S. patent application Ser. No. 09/192,839, U.S. Pat. No. 6,145,105, can be used to design the appropriate test controller. In both cases, the effective shift clock frequency can be ¼th of the reference test clock applied to the test controller. Thus, clock frequency ratios of one or more can be handled.

It will be understood by those skilled in the art that various modifications and alterations can be made to the above described invention without departing from the spirit of the invention as defined by the appended claims.

We claim:

1. A method of performing an at-speed test, using a test clock and a system clock, of a circuit having combinational logic and scannable, clocked scan type memory elements having a capture clock input and a shift clock input, said method comprising:

configuring said circuit in an active or an inactive initialization mode;

when said circuit is configured in an active initialization mode,
   disabling any sequential loops associated with non-scannable memory elements in said combinational logic;
   disabling analysis of test response data;
   performing a predetermined number of initialization cycles including:
      loading initialization data into said scannable memory elements under the control of a clock signal derived from one of a test clock and a system clock; and
      performing a capture cycle under the control of a clock signal derived from one of a test clock and a system clock;
   deactivating said initialization signal; and
   enabling any disabled sequential loops in said combinational logic;

loading a test stimulus into said scannable memory elements under the control of a shift clock signal derived from said test clock;

performing a capture operation under the control of a capture clock derived from one of said test clock and a free running system clock for a predetermined number of cycles of said capture clock;

enabling analysis of test response data; and unloading test response data from said scannable memory elements under the control of said shift clock signal.

2. A method as defined in claim 1, each said loading a test stimulus and loading initialization data including:

generating an active scan enable signal and an active capture clock control signal;

generating an active shift clock derived from said test clock in response to said active scan enable signal; and generating an inactive scan enable signal at the end of said loading shift sequence and disabling said shift clock in response to said inactive scan enable signal.

3. A method as defined in claim 2, said generating an active capture clock control signal including deriving said capture clock control signal from said scan enable signal and maintaining said control signal active for said predetermined number of half clock cycles of said test clock following said generating an inactive scan enable signal.

4. A method as defined in claim 2, said performing a capture operation including maintaining said control signal active for said predetermined number of half clock cycles of said test clock following disabling said shift clock and then deactivating said control signal; and said performing said capture operation including performing said capture operation in response to a transition from an active to an inactive state of said control signal.

5. A method as defined in claim 1, said predetermined number of initialization cycles being at least the maximum number of non-scannable memory elements disposed in any path between two scannable memory elements in said circuit.

6. A method as defined in claim 1, said configuring said circuit including generating a Debug signal, said performing a capture operation further including selecting a capture clock derived from said test clock in response to an active value of a Debug signal.

7. A method of performing an at-speed test of a circuit having combinational logic and scannable, clocked scan type memory elements using a free-running test clock and a free running system clock, each said scannable memory elements having a capture clock input, a shift clock input, said method comprising:
generating an active Scan Enable signal, an initialization signal, a capture clock control signal;
while said initialization signal is active, performing a predetermined number of non-scannable memory element initialization cycles, including:
enabling a shift clock derived from said free running test clock in response to said active Scan Enable signal;
loading initialization data into said scannable memory elements according to a shift sequence under the control of said shift clock;
deactivating said Scan Enable signal and disabling said shift clock in response to said inactive Scan Enable signal;
enabling a capture clock derived from one of said test and system clocks in response to said inactive Scan Enable signal;
applying one clock cycle of said capture clock;
deactivating said initialization signal when all non-scannable memory elements in said circuit have been initialized;
loading a test stimulus into said scannable memory elements according to a shift sequence including:
generating an active scan enable signal;
enabling a shift clock derived from said free running test clock in response to said active Scan Enable signal;
serially shifting said test stimulus into said scannable memory elements under the control of said shift clock;
deactivating said Scan Enable signal; and
disabling said shift clock in response to said inactive Scan Enable signal;
performing a capture operation including:
selecting one of said test and system clocks as a capture clock;
delaying enabling said capture clock while said capture clock control signal is active;
enabling said capture clock for at least two clock cycles thereof;
unloading test response data from said scannable memory elements including:
generating an active scan enable signal;
enabling said shift clock derived from said free running test clock in response to said active Scan Enable signal;
serially shifting said test response data from said scannable memory elements under the control of said shift clock; and
analyzing said test response data.

8. A method of performing an at-speed test, using a free running test clock and a free running system clock, of a circuit having combinational logic and scannable, clocked scan type memory elements each said scannable memory elements having a capture clock input and a shift clock input, said method comprising:
loading a test stimulus into said scannable memory elements under the control of a shift clock derived from said free running test clock;
performing a capture operation under the control of a capture clock derived from one of said free running test clock and said free running system clock for a predetermined number of cycles of said capture clock; and
unloading test response data from said scannable memory elements under the control of said shift clock.

9. A method as defined in claim 8, further including initializing any non-scannable memory elements in said circuit prior to loading a test stimulus by performing a predetermined number of initialization sequences including loading initialization data into said scannable memory elements under control of said test clock and then operating said circuit in normal mode for one clock cycle of one of said test clock and said system clock.

10. A method as defined in claim 9, said predetermined number of initialization sequences being at least the maximum number of non-scannable memory elements disposed in any path between two scannable memory elements in said circuit.

11. A method of performing an at-speed test of a circuit having combinational logic and scannable, clocked scan type memory elements each said scannable memory elements having a capture clock input, a shift clock input, said method comprising:
configuring said circuit in an active or an inactive debug mode;
when said circuit is configured in an active debug mode,
loading a test stimulus into said scannable memory elements under the control of a shift clock signal derived from a test clock;
performing a capture operation under the control of a capture clock derived from said test clock for a predetermined number of cycles of said capture clock; and
unloading test response data from said scannable memory elements under the control of said shift clock signal; and
when said circuit is configured in an inactive debug mode,
loading a test stimulus into said scannable memory elements under the control of a shift clock signal derived from a test clock;
performing a capture operation under the control of a capture clock derived from one of said test clock and a system clock for a predetermined number of cycles of said capture clock; and
unloading test response data from said scannable memory elements under the control of said shift clock signal.

12. A method of performing an at-speed test of a circuit having combinational logic and scannable, clocked scan type memory elements each said scannable memory elements having a capture clock input, a shift clock input, said method comprising:
configuring said circuit in an active or an inactive debug mode;
configuring said circuit in an active or an inactive initialization mode;
when said circuit is configured in an inactive debug mode,
when said circuit is configured in an active initialization mode,
disabling any sequential loops associated with non-scannable memory elements in said combinational logic;
initializing non-scannable memory elements in said circuit including:
disabling analysis of test response data;

iteratively loading initialization data into said scannable memory elements and then performing a capture cycle under the control of a shift clock derived from one of a free running test clock and a free running system clock until completion of initialization of non-scannable memory elements in said circuit with known values and then deactivating said initialization signal;

enabling analysis of test response data; and enabling any disabled sequential loops in said combinational logic loading a test stimulus into said scannable memory elements under the control of a shift clock signal derived from one of said a free running test clock and a free running system clock;

performing a capture operation under the control of a capture clock derived from said system clock and a free running system clock for a predetermined number of cycles of said capture clock;

unloading test response data from said scannable memory elements under the control of said shift clock;

when said circuit is configured in an inactive initialization mode, loading a test stimulus into said scannable memory elements under the control of a shift clock signal derived from one of said a free running test clock and a free running system clock;

performing a capture operation under the control of a capture clock derived from one of said test clock and a free running system clock for a predetermined number of cycles of said capture clock; and unloading test response data from said scannable memory elements under the control of said shift clock;

when said circuit is configured in an active debug mode, when said circuit is configured in an active initialization mode, initializing non-scannable memory elements in said circuit including:

disabling any sequential loops associated with non-scannable memory elements in said combinational logic;

disabling analysis of test response data;

iteratively loading initialization data into said scannable memory elements and then performing a capture cycle under the control of a shift clock derived from a free running test clock until completion of initialization of non-scannable memory elements in said circuit with known values and then deactivating said initialization signal;

enabling analysis of test response data;

enabling any disabled sequential loops in said combinational logic; and loading a test stimulus into said scannable memory elements under the control of a shift clock signal derived from one of said free running test clock and a free running system clock;

performing a capture operation under the control of a capture clock derived from said test clock for a predetermined number of cycles of said capture clock;

unloading test response data from said scannable memory elements under the control of said shift clock;

when said circuit is configured in an inactive initialization mode, loading a test stimulus into said scannable memory elements under the control of a shift clock signal derived from said free running test clock;

performing a capture operation under the control of a capture clock derived from said test clock for a predetermined number of cycles of said capture clock; and unloading test response data from said scannable memory elements under the control of said shift clock; and analyzing and validating said response data.

13. A BIST controller for an integrated circuit having combinational logic and scannable clocked scan type memory elements connected to said combinational logic and having a capture clock input, a shift clock input, a data input, a data output, a serial data input and a serial data output, said controller comprising:

a control circuit for generating a scan enable signal and an initialization control signal;

a clock generating circuit for receiving a test clock and a system clock and for generating a shift clock and a capture clock;

means responsive to an active scan enable signal and said test clock for generating a test stimulus and serially loading said test stimulus into said scannable memory elements; and means responsive to an inactive initialization control signal and an active scan enable signal for analysing test response data unloaded from said scannable memory elements;

said clock generating circuit including:

means for producing said shift clock, said means for producing having a shift clock output and a test clock input and being responsive to an active scan enable signal for connecting said test clock input to said shift clock output and responsive to an inactive scan enable signal for disabling said shift clock output; and means for generating said capture clock having a test clock input, a system clock input and a capture clock output and being responsive to an inactive scan enable signal and an active initialization control signal for connecting one of said test and system clocks to said capture clock output for one clock cycle of said capture clock and responsive to an inactive scan enable signal and an inactive initialization signal for connecting said system clock input to said capture clock output for at least two cycles of said capture clock.

14. A BIST controller as defined in claim 13, said means for generating a capture clock including:

capture delay means for producing a capture clock control signal for delaying enabling of said capture clock for a predetermined time interval following said scan enable signal becoming inactive;

transition detection means responsive said capture clock control signal for detecting a transition from active to inactive of said capture clock control signal for producing a capture clock enable signal enabling said capture clock; and means receiving said system clock and responsive to an active capture clock enable signal for connecting said system clock to said capture clock output.

15. A BIST controller as defined in claim 14, said delay means including at least one memory element and producing said capture clock control signal.

16. A BIST controller as defined in claim 15, said delay means receiving said scan enable signal.

17. A BIST controller as defined in claim 15, said means responsive to the transition including a transition detector operating under the control of said system clock for sampling said capture clock control signal and for producing an active capture clock enable signal in response to detecting a transition from an active to an inactive value of said control signal.

18. A BIST controller as defined in claim 17, said transition detector further including means for determining the number of capture clock cycles to be performed during a capture operation.

19. A BIST controller as defined in claim 13, said control circuit being responsive to an input Debug signal for generating an active Debug signal, said clock generating signal being responsive to an active debug signal by generating shift and capture clocks derived from said test clock.

20. A BIST controller as defined in claim 13, further including storage means for storing the maximum number of non-scannable memory elements disposed in any path between two scannable memory elements in said circuit.

21. A BIST controller as defined in claim 13, further including means responsive to an active Debug signal for selecting said test clock for loading, unloading and capture operations.

22. A BIST controller as defined in claim 21, said control circuit being responsive to an active input Debug signal for generating an active Debug signal.

23. A BIST controller as defined in claim 13, said test and system clocks being free-running clocks.

24. A BIST controller for an integrated circuit having combinational logic and scannable clocked scan type memory elements connected to said combinational logic and having a capture clock input, a shift clock input, a data input, a data output, a serial data input and a serial data output, said controller comprising:
   a control circuit for generating a scan enable signal and an initialization control signal;
   a clock generating circuit for receiving a test clock and a system clock and for generating a shift clock and a capture clock;
   means responsive to an active scan enable signal and said test clock for generating a test stimulus and serially loading said test stimulus into said scannable memory elements; and
   means responsive to an inactive initialization control signal and an active scan enable signal for analysing test response data unloaded from said scannable memory elements;
   said clock generating circuit including:
      means for producing said shift clock, said means for producing having a shift clock output and a test clock input and being responsive to an active scan enable signal for connecting said test clock input to said shift clock output and responsive to an inactive scan enable signal for disabling said shift clock output; and
      means for generating said capture clock responsive to an inactive scan enable signal and an active initialization control signal for connecting one of said test and system clocks to said capture clock output for one clock cycle of said capture clock and responsive to an inactive scan enable signal and an inactive initialization signal for connecting said system clock input to said capture clock output for at least two cycles of said capture clock and further including:
      a test clock input,
      a system clock input;
      a capture clock output;
      delay means for producing a capture clock control signal for delaying enabling of said capture clock for a predetermined time interval following said scan enable signal becoming inactive;
      transition detection means responsive said capture clock control signal for detecting a transition from active to inactive of said capture clock control signal for producing a capture clock enable signal enabling said capture clock; and
      means receiving said system clock and responsive to an active capture clock enable signal for connecting said system clock to said capture clock output.

25. A BIST controller as defined in claim 24, said control circuit being responsive to an input Debug signal for generating an active Debug signal, said clock generating signal being responsive to an active debug signal by generating shift and capture clocks derived from said test clocks.

26. A BIST controller as defined in claim 24, further including storage means for storing the maximum number of non-scannable memory elements disposed in any path between two scannable memory elements in said circuit.

27. A BIST controller as defined in claim 24, said delay means including at least one memory element and producing said capture clock control signal.

28. A BIST controller as defined in claim 27, said delay means receiving said scan enable signal.

29. A BIST controller as defined in claim 27, said means responsive to the transition including a transition detector operating under the control of said system clock for sampling said capture clock control signal and for producing an active capture clock enable signal in response to detecting a transition from an active to an inactive value of said control signal.

30. A BIST controller as defined in claim 29, said transition detector further including means for determining the number of capture clock cycles to be performed during a capture operation.

31. A BIST controller as defined in claim 24, further including means responsive to an active Debug signal for selecting said test clock for loading, unloading and capture operations.

32. A BIST controller as defined in claim 31, said control circuit being responsive to an active input Debug signal for generating an active Debug signal.

33. A BIST controller as defined in claim 24, said test and system clocks being free-running clocks.

34. In an integrated circuit having combinational logic and scannable clocked scan type memory elements connected to said combinational logic and having a capture clock input, a shift clock input, a data input, a data output, a serial data input and a serial data output, the improvement comprising:
   a BIST controller having:
      a control circuit for generating a scan enable signal and an initialization control signal;
      a clock generating circuit for receiving a test clock and a system clock and for generating a shift clock and a capture clock;
      means responsive to an active scan enable signal and said test clock for generating a test stimulus and serially loading said test stimulus into said scannable memory elements; and
      means responsive to an inactive initialization control signal and an active scan enable signal for analysing test response data unloaded from said scannable memory elements;

said clock generating circuit including:

means for producing said shift clock, said means for producing having a shift clock output and a test clock input and being responsive to an active scan enable signal for connecting said test clock input to said shift clock output and responsive to an inactive scan enable signal for disabling said shift clock output; and means for generating said capture clock having a test clock input, a system clock input and a capture clock output and being responsive to an inactive scan enable signal and an active initialization control signal for connecting one of said test and system clocks to said capture clock output and responsive to an inactive scan enable signal and an inactive initialization signal for connecting said system clock input to said capture clock output for at least two cycles of said capture clock; and said combinational logic means responsive to an active initialization signal for disabling any sequential loops associated with non-scannable memory elements in said combinational logic and responsive to an inactive initialization signal for enabling any disabled sequential loops associated with non-scannable memory elements in said combinational logic.

35. A BIST controller as defined in claim 34, said means for generating a capture clock including:

capture delay means for producing a capture clock control signal for delaying enabling of said capture clock for a predetermined time interval following said scan enable signal becoming inactive;

transition detection means responsive said capture clock control signal for detecting a transition from active to inactive of said capture clock control signal for producing a capture clock enable signal enabling said capture clock; and means receiving said system clock and responsive to an active capture clock enable signal for connecting said system clock to said capture clock output.

36. An integrated circuit as defined in claim 35, said control circuit being responsive to an input Debug signal for generating an active Debug signal, said clock generating signal being responsive to an active debug signal by generating shift and capture clocks derived from said test clock.

37. A BIST controller as defined in claim 36, said delay means including at least one memory element and producing said capture clock control signal.

38. A BIST controller as defined in claim 36, said delay means receiving said scan enable signal.

39. A BIST controller as defined in claim 36, said means responsive to the transition including a transition detector operating under the control of said system clock for sampling said capture clock control signal and for producing an active capture clock enable signal in response to detecting a transition from an active to an inactive value of said control signal.

40. A BIST controller as defined in claim 39, said transition detector further including means for determining the number of capture clock cycles to be performed during a capture operation.

41. A BIST controller as defined in claim 39, further including means responsive to an active Debug signal for selecting said test clock for loading, unloading and capture operations.

42. A BIST controller as defined in claim 39, said control circuit being responsive to an active input Debug signal for generating an active Debug signal.

43. A BIST controller as defined in claim 39, said test and system clocks being free-running clocks.

44. A BIST controller as defined in claim 35, further including storage means for storing the maximum number of non-scannable memory elements disposed in any path between two scannable memory elements in said circuit.

* * * * *